US011227989B2

(12) United States Patent
Weilguni et al.

(10) Patent No.: US 11,227,989 B2
(45) Date of Patent: Jan. 18, 2022

(54) PIEZOELECTRIC TRANSFORMER

(71) Applicant: EPCOS AG, Munich (DE)

(72) Inventors: Michael Weilguni, Hagenberg (AT); Franz Rinner, Deutschlandsberg (AT)

(73) Assignee: EPCOS AG, Munich (DE)

(*) Notice: Subject to any disclaimer, the term of this patent is extended or adjusted under 35 U.S.C. 154(b) by 810 days.

(21) Appl. No.: 15/766,798

(22) PCT Filed: Sep. 23, 2016

(86) PCT No.: PCT/EP2016/072734
§ 371 (c)(1),
(2) Date: Apr. 6, 2018

(87) PCT Pub. No.: WO2017/060104
PCT Pub. Date: Apr. 13, 2017

(65) Prior Publication Data
US 2018/0287043 A1   Oct. 4, 2018

(30) Foreign Application Priority Data
Oct. 7, 2015   (DE) .......................... 102015117106.6

(51) Int. Cl.
*H01L 41/047* (2006.01)
*H01L 41/107* (2006.01)
(Continued)

(52) U.S. Cl.
CPC ........ *H01L 41/0471* (2013.01); *H01L 41/044* (2013.01); *H01L 41/083* (2013.01); *H01L 41/107* (2013.01); *H01L 41/29* (2013.01)

(58) Field of Classification Search
CPC . H01L 41/0471; H01L 41/044; H01L 41/083; H01L 41/107
See application file for complete search history.

(56) References Cited

U.S. PATENT DOCUMENTS

| 5,504,384 A | 4/1996 | Lee et al. |
|---|---|---|
| 6,065,196 A | 5/2000 | Inoi et al. |

(Continued)

FOREIGN PATENT DOCUMENTS

| CN | 1178603 A | 4/1998 |
|---|---|---|
| CN | 1178604 A | 4/1998 |

(Continued)

OTHER PUBLICATIONS

English Translation of KR 20050000886, Kim (Year: 2005).*
(Continued)

*Primary Examiner* — Bryan P Gordon
(74) *Attorney, Agent, or Firm* — Morgan, Lewis & Bockius LLP

(57) ABSTRACT

The invention relates to a piezoelectric transformer having a piezoelectric element (1) of the length L, wherein an input voltage $U_{in}$ can be applied on an input side (2) for being transformed into an output voltage $U_{out}$ on the output side (3) according to a transformation ratio $U_{out}/U_{in}=K_u$. The piezoelectric element (1) comprises multiple plies (4a, 4b, 4c) of inner electrodes, which are arranged in multiple different layers (S1, S2, S3). Each ply (4a, 4b, 4c) of inner electrodes extends along at least one predetermined sub-section of a predetermined length, wherein sub-sections of plies (4a, 4c) of a first group of layers (S1, S3) and sub-sections of plies (4b) of a second group of layers (S2) have different dimensions, so that the piezoelectric transformer satisfies the following condition: $C_{in} \leq N^2 C_{out}$, wherein $C_{in}$ indicates the input capacitance, $C_{out}$ indicates the output capacitance, and N indicates the transformation ratio of the ideal transformer.

17 Claims, 3 Drawing Sheets

Figure 1:
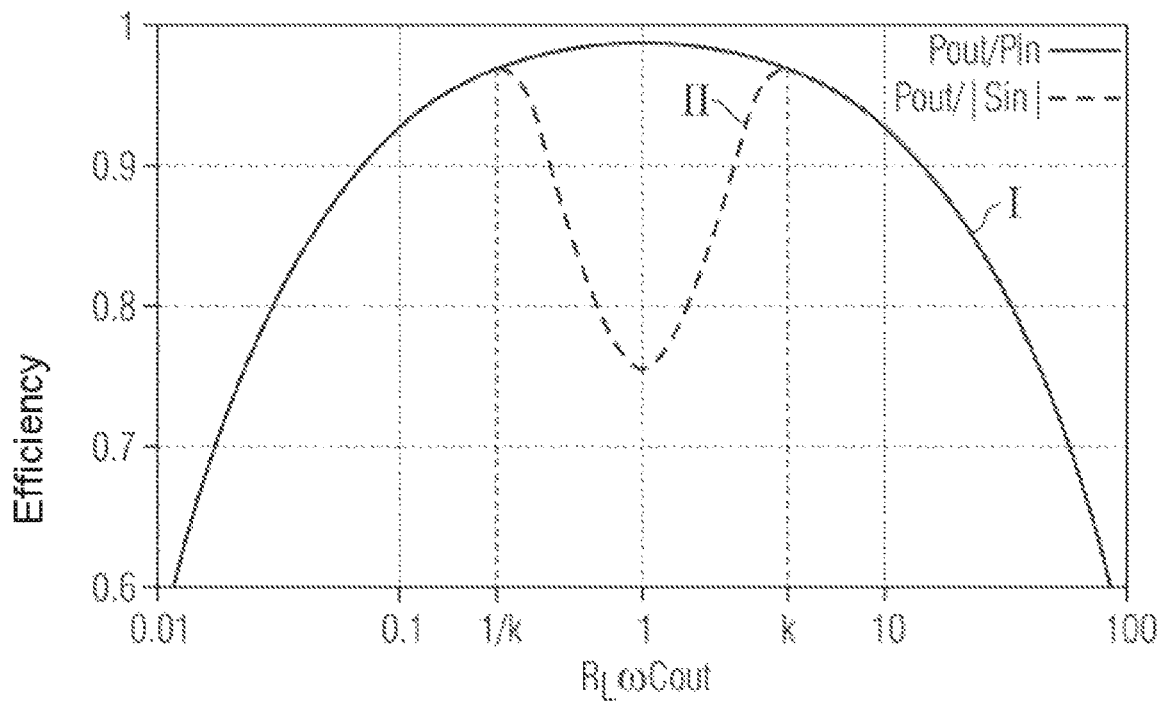

(51) Int. Cl.
*H01L 41/04* (2006.01)
*H01L 41/083* (2006.01)
*H01L 41/29* (2013.01)

(56) References Cited

U.S. PATENT DOCUMENTS

| | | | |
|---|---|---|---|
| 6,229,251 B1 * | 5/2001 | Asada | H01L 41/107 310/359 |
| 6,362,560 B1 | 3/2002 | Yang et al. | |
| 6,812,623 B2 * | 11/2004 | Takeda | H01L 41/107 310/359 |
| 2001/0028206 A1 * | 10/2001 | Watanabe | H01L 41/107 310/366 |
| 2003/0102779 A1 * | 6/2003 | Kim | H01L 41/107 310/359 |
| 2003/0137222 A1 | 7/2003 | Takeda et al. | |
| 2007/0278906 A1 * | 12/2007 | Florian | H01L 41/107 310/359 |
| 2014/0167571 A1 | 6/2014 | Meyer | |
| 2016/0064640 A1 * | 3/2016 | Jeong | H01L 41/107 323/359 |

FOREIGN PATENT DOCUMENTS

| | | |
|---|---|---|
| CN | 1423349 A | 6/2003 |
| CN | 1853286 A | 10/2006 |
| CN | 1864317 A | 11/2006 |
| CN | 101593807 A | 12/2009 |
| CN | 101714455 A | 5/2010 |
| CN | 102194571 A | 9/2011 |
| JP | H11261125 A | 9/1999 |
| JP | H11330579 A | 11/1999 |
| JP | 2002-217467 A | 8/2002 |
| JP | 2003-037309 A | 2/2003 |
| JP | 2004335939 A | 11/2004 |
| KR | 2005-0000886 A | 1/2005 |
| KR | 20050000888 A | 1/2005 |
| KR | 100550848 B1 | 2/2006 |

OTHER PUBLICATIONS

K. S. Meyer et al.: "Parameterized Analysis of Zero Voltage Switching in Resonant Converters for Optimal Electrode Layout of Piezoelectric Transformers" Technical University of Denmark; DTU Elektro; Elektrovej Building 325; DK-2800 Kgs. Lyngby; Denmark; Homepage: www.noliac.com; pp. 2543-2548.

* cited by examiner

PIEZOELECTRIC TRANSFORMER

The invention relates to a piezoelectric transformer, including a piezoelectric element with a predetermined longitudinal dimension of length L, along which at least one input side and at least one output side of the transformer are defined. On the input side, an input voltage $U_{in}$ can be applied for being transformed into an output voltage $U_{out}$ on the output side according to a transformation ratio $U_{out}/U_{in}=K_u$. The piezoelectric element in this case comprises multiple plies of inner electrodes, which are arranged in a direction perpendicular to the direction of the longitudinal dimension in multiple different layers.

Such types of piezoelectric transformers are widely used for voltage transformation. The efficiency maximum of such a piezoelectric transformer is reached at a specific resonance frequency, when the load on the output side corresponds to the impedance of the output capacitance (electrical capacitance between a possibly metallized area on the output side and the inner electrodes) of the piezoelectric transformer. In a conventional piezoelectric transformer, the input impedance exhibits capacitive behavior in a certain range around this efficiency maximum. The input power of the transformer thus contains a reactive power component in this range.

Conventional solutions provide for a series inductance for compensating the capacitive input behavior of the piezoelectric transformer in the control. However, the transfer of the electric energy between the input capacitance (electrical capacitance between the plies of inner electrodes and the piezoelectric substrate on the input side) of the piezoelectric transformer and the series inductance in the control does not occur without losses. In addition, the finite electrode conductance of the inner electrodes leads to a heat-up of the component.

Another option would be to operate the piezoelectric transformer so far outside of the maximum efficiency range that the input impedance becomes purely ohmic. Outside of the maximum efficiency range, however, the losses in the piezoelectric element likewise increase.

Accordingly, it is an object of the invention to minimize or to completely suppress the reactive power component of the input impedance in a piezoelectric transformer such that electrical losses are minimized in the component, and yet the transformer can be operated at maximum possible efficiency.

This object is achieved by a piezoelectric transformer of the type mentioned above in that each ply of inner electrodes extends along at least one predetermined sub-section of the longitudinal dimension, and that the sub-sections of plies of a first group of layers and the sub-sections of plies of a second group of layers have different dimensions, so that the piezoelectric transformer satisfies the following condition:

$$C_{in} \leq N^2 C_{out},$$

wherein $C_{in}$ indicates the input capacitance, $C_{out}$ indicates the output capacitance, and N indicates the transformation ratio of the ideal transformer.

Figure 5:
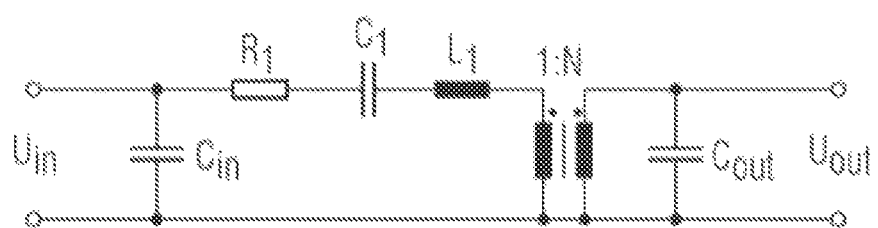

The condition shown above corresponds to a view according to an equivalent circuit diagram of the piezoelectric transformer. Such an equivalent circuit diagram is shown in FIG. 5. This shows a conventionally used description, simplified in terms of circuitry of the piezoelectric transformer of the type explained here. An input voltage $U_{in}$ is applied on an input side, and an output voltage $U_{out}$ is present on an output side. The input capacitance $C_{in}$ is formed on the input side, and the output capacitance $C_{out}$ is formed on the output side. Besides the further equivalent circuit diagram parameters $R_1$, $C_1$ and $L_1$, which describe the transmission and coupling properties of the piezoelectric substrate, a transformation in the equivalent circuit diagram through an ideal transformer with the transformation ratio of input side to output side of 1:N (or output side to the input side=N) is illustrated.

The advantage of a piezoelectric transformer of the type described compared to transformers of conventional design is that the input impedance of the transformer under any desired resistive and capacitive load is purely ohmic in each case at maximum possible efficiency and contains no or rather only a negligible reactive power component. These properties are achieved in that the piezoelectric transformer satisfies the condition $C_{in} \leq N^2 C_{out}$ as explained above. This condition is satisfied in that the input capacitance of the transformer is reduced by suitable electrode design of the inner electrodes, while simultaneously the transformation ratio remains largely unchanged. Through a different dimensioning of the sub-sections of plies of inner electrodes of a first group of layers compared to the sub-sections of plies of a second group of layers in the piezoelectric element, in particular the proportional ratio of the input capacitance $C_{in}$ to the output capacitance $C_{out}$ of the piezoelectric transformer can be influenced.

In particular, the sub-sections of the plies according to the first group of layers can be of smaller dimension than the sub-sections of plies according to the second group of layers. The plies of the first group of layers thus affect the input capacitance $C_{in}$, wherein this is reduced corresponding to the reduction of the sub-sections of plies of the first group of layers as compared with conventional electrode designs.

Since the sub-sections of plies from the second group of layers are thus dimensioned larger than the sub-sections of plies from the first group of layers, the plies from the second group of layers electro-physically determine the capacitance of the piezoelectric transformer regarding the output side, i.e., its output capacitance $C_{out}$. Through suitable dimensioning of the difference in length of the sub-sections of plies according to the second group of layers relative to the plies of the first group of layers, the output capacitance $C_{out}$ thus remains unchanged, or can additionally even be increased as compared to conventional electrode designs in piezoelectric transformers.

In short, through different dimensioning and measurement of sub-sections of plies of inner electrodes of a first group of layers in relation to the sub-sections of plies of inner electrodes according to a second group of layers, it can be achieved that the input capacitance $C_{in}$ is smaller than or equal to the output capacitance $C_{out}$ multiplied by the square of the transformation ratio N, so that the above condition is satisfied. As already mentioned, a purely ohmic input impedance of the piezoelectric transformer can thus be obtained, wherein the piezoelectric transformer does not have any reactive power component on its input side for different loads on its output side.

In one embodiment, the piezoelectric transformer is configured as a Rosen-type transformer. The piezoelectric element is, for example, composed of a lead zirconate titanate ceramic (PZT). The inner electrodes are, for example, produced from silver-palladium or copper. In the case of a piezoelectric element manufactured in a suitable multi-layer design, 50 layers can, for example, be stacked in a direction perpendicular to the direction of the longitudinal dimension of the piezoelectric element, wherein, in certain (or all) of these layers, a corresponding ply of inner electrodes is formed. The piezoelectric element is, for example, dimensioned such that it has a certain longitudinal dimension of the length L, a certain width dimension of the width B, and a certain height dimension of the height H. Thus, the longitudinal dimension of the length L refers to the main dimension of the piezoelectric element. The piezoelectric element is therefore longer than wide and longer than high.

According to one embodiment, the piezoelectric element is polarized in a direction perpendicular to the direction of the longitudinal dimension on its input side, and is polarized in the direction of the longitudinal dimension on the output side. This means that the piezoelectric transformer, on the input side, is operated in the so-called 31 mode (transversal mode) and, on the output side, is operated in the so-called 33 mode (longitudinal mode), wherein the piezoelectric element completes a transversal movement in direction of its longitudinal dimension upon application of an electric field on its input side in the direction of polarization. This movement leads to a shift of electrical charge carriers in the piezoelectric element such that, in turn, an electrical voltage is present in the direction of the longitudinal dimension, that is, in longitudinal direction, which is present, as output voltage $U_{out}$ of the transformer, on the output side.

In one embodiment, the input side of the piezoelectric element is configured in the range of 0 to ½L of the longitudinal dimension, wherein the output side of the piezoelectric element is configured in the range of ½L to L of the longitudinal dimension.

The achievement of the above-mentioned advantageous characteristics of the piezoelectric transformer disclosed herein relies on the considerations that the capacitive behavior of a conventional piezoelectric transformer at maximum efficiency is due to the fact that the input of the piezo-transformer is operated in the 31-mode, and the output in the 33-mode. This means that the piezoelectric charge constant $d_{31}$ on the input side is smaller than the piezoelectric charge constant $d_{33}$ on the output side, wherein the effective coupling factor $k_{eff,in}$ of the input, is smaller than the effective coupling factor $k_{eff,out}$ of the output. In terms of electricity, this means that, in piezoelectric transformers of the conventional type, the input capacitance $C_{in}$ is always higher than the output capacitance $C_{out}$ multiplied with the square of the transformation ratio N. Based on analytical examination of the properties of the piezoelectric transformer using an equivalent circuit diagram, it can be shown that the input impedance of the transformer becomes capacitive if, during operation of the transformer, the output load $R_L$ is within a certain efficiency range, which can be mathematically described as follows:

$$R_{L,eff}/k < R_L < R_{L,eff} \cdot k \text{ with } k = \frac{C_{in}}{C_{out}N^2}\left(1 + \sqrt{1 - \left(\frac{C_{out}N^2}{C_{in}}\right)^2}\right)$$

This behavior of a conventional piezoelectric transformer is also clarified in FIG. 1. For one, FIG. 1 shows a characteristic curve I of the efficiency of a conventional piezoelectric transformer, which is defined as the ratio of the active power levels of output and input $P_{out}/P_{in}$ plotted against a normalized load ($R_L\omega C_{out}$) on the output. Furthermore, FIG. 1 shows a further characteristic curve II, which indicates the ratio of the output active power $P_{out}$ to the absolute value of the input apparent power $S_{in}$. It can be taken from FIG. 1, that the characteristic curve II, in the range $1/k<R_L\omega C_{out}<k$, drops from two boundary extrema (see perpendicular markings) to a local minimum at $R_L\omega C_{out}=1$. In the illustrated range, the input impedance of a conventional piezoelectric transformer has a capacitive component, which necessitates a reactive power. Thus, the ratio of the output active power $P_{out}$ to the absolute value of the input apparent power $S_{in}$ declines symmetrically down to $R_L\omega C_{out}=1$ due to the reactive power component. At this point, the reactive power due to a maximum capacitive behavior of the input impedance is greatest, so that the efficiency of the active power $P_{out}/P_{in}$ is at the lowest here.

The present invention now makes use of the knowledge that the ratio of $C_{in} \leq N^2 C_{out}$ depends, in a first approximation, on the ratio of the piezoelectric charge constants $d_{33}/d_{31}$. Through a suitable electrode design, it can be achieved that the input capacitance is reduced such that, upon reaching the condition $C_{in}=N^2C_{out}$ in the above-mentioned analytical description of the range, which is also illustrated in FIG. 1, the expression for k becomes k=1. This means that under the condition $C_{in} \leq N^2 C_{out}$, the area illustrated in FIG. 1 disappears. Under the named condition, the input impedance of a piezoelectric transformer is thus purely ohmic at maximum efficiency, and does not contain any capacitive component, which, in turn, would produce a reactive power of the input power. Furthermore, the piezoelectric charge constant $d_{31}$ on the input side, under this condition, is greater than the piezoelectric charge constant $d_{33}$ on the output side. This means that the effective coupling factor $k_{eff,in}$ on the input side is also greater than the effective coupling factor $k_{eff,out}$ on the output side.

Based on this knowledge and the already-mentioned differing dimensioning of the inner electrodes in different layers of the piezoelectric element, the input impedance can, under any resistive or capacitive load on the output of the transformer, be resistively dimensioned purely ohmic, with in each case maximum efficiency, so that it does not contain any reactive power component. One advantage lies in that, in the control, a conventional series inductance can be dispensed with, and thus the overall efficiency of the system of piezoelectric transformer and control circuit can be increased. Another advantage is that a control at maximum efficiency at any load at the output is simple to implement. Due to the purely ohmic input impedance, the phase angle of the input impedance at maximum efficiency is always φ=0°, so that the time courses of input current and input voltage are always consistent. This way, a control of the piezoelectric transformer can be kept simple, wherein a frequency control is only carried out in such a way that the efficiency $P_{out}/P_{in}$ is controlled at a maximum with a load present correspondingly on the output. Ideally, the efficiency maximum is at the resonant frequency of the piezoelectric element when the output load corresponds to the impedance of the output capacitance $C_{out}$ of the piezoelectric transformer.

An example of a control of the piezoelectric transformer is the use of such to generate a non-thermal atmospheric pressure plasma. In this case, the load, to be considered as non-inductive, i.e. resistive and/or capacitive, on the output of the piezoelectric transformer, is a function of the plasma. Since the plasma, in turn, depends on the properties of the atmosphere or of the working gas used, the load, acting through the plasma, is generally variable. Although such a variable load can have an impact on a phase shift of the time profiles of input current and input voltage at the transformer, however, the frequency can be relatively easily readjusted so that the phase shift becomes φ=0°. Thus, a control to a efficiency maximum can be made simple.

Advantageously, a control of the piezoelectric transformer of the type described here occurs via a sinusoidal input voltage signal. The sinusoidal input voltage signal can, for example, be generated through a high-frequency pulse width modulated (PWM) switching signal.

In one embodiment of the piezoelectric transformer of the explained type, layers of the piezo group alternate with layers of the second group. This means that in each case a layer having a ply of inner electrodes according to a first configuration with respect to the longitudinal dimension respectively alternates with a layer comprising a ply of inner electrodes according to a second configuration with respect to the longitudinal dimension in the direction of the layer structure on the piezoelectric element. In this way, a homogeneous distribution of the plies of inner electrodes with differing dimensions along the layer structure of the piezoelectric element can be achieved.

According to one embodiment of the piezoelectric transformer, the plies of inner electrodes of the first group of layers each extend between a first and a second position in a range >0 and ≤½L of the longitudinal dimension, wherein the respective sub-section between the first and the second position has a length of ≤¼L of the longitudinal dimension. It has been found that in such a dimensioning of the plies of inner electrodes of the first group of layers, the input capacitance $C_{in}$ of the piezoelectric transformer can be dimensioned small enough to satisfy the condition $C_{in} \leq N^2 C_{out}$.

In one embodiment of the piezoelectric transformer, the plies of inner electrodes of the first group of layers extend respectively between the first and the second position symmetrically around the position at ¼L of the longitudinal dimension. Such an arrangement of the plies of inner electrodes symmetrically around the position at ¼L of the longitudinal dimension has electromechanical reasons. When operating the piezoelectric transformer with a periodic input voltage signal, the transformer can be induced to transversal oscillations of the second harmonic with respect to a base frequency. Here, two nodes arise along the piezoelectric element at ¼L and ¾L of the longitudinal dimension. Thus, at these positions, no (or only a negligible) mechanical deformation work occurs on the piezoelectric element. Furthermore, the coupling effect of the electrical energy into the piezoelectric element at these points is optimal. If one looks at the input side of the piezoelectric element in a range from 0 to ≤½L of the longitudinal dimension, the position at ¼L of the longitudinal dimension then constitutes an optimal point of symmetry for forming the plies of inner electrodes of the first group of layers.

In one embodiment of the piezoelectric transformer, the plies of inner electrodes of the second group of layers each extend between a first and a second position in a range >0 and ≤½L of the longitudinal dimension, wherein the respective sub-section, between the first and the second position, has a length of >¼L and <½L of the longitudinal dimension. Such a configuration of the plies of inner electrodes of the second group of layers has the advantage that the output capacitance $C_{out}$ is not reduced. In combination with the configuration of the plies of inner electrodes of the first group of layers, as discussed above, the condition $C_{in} \leq N^2 C_{out}$ can thus be very well achieved.

Complementary to this, the plies of inner electrodes of the second group of layers, in one embodiment, can also each additionally extend in a sub-section between a third and a fourth position in a range ≥⅞L and ≤L of the longitudinal dimension.

In an alternative embodiment, the plies of inner electrodes of the second group of layers each extend between a first and a second position in a range of >0 and ≤¾L of the longitudinal dimension, wherein the respective sub-section, between the first and the second position, has a length of ≥⅜L and <¾L of the longitudinal dimension.

By the alternative embodiments of the latter kind, the output capacitance $C_{out}$ can be made larger, whereby the condition $C_{in} \leq N^2 C_{out}$ can likewise be met.

The invention will now be described in greater detail by means of multiple drawings.

Figure 2:
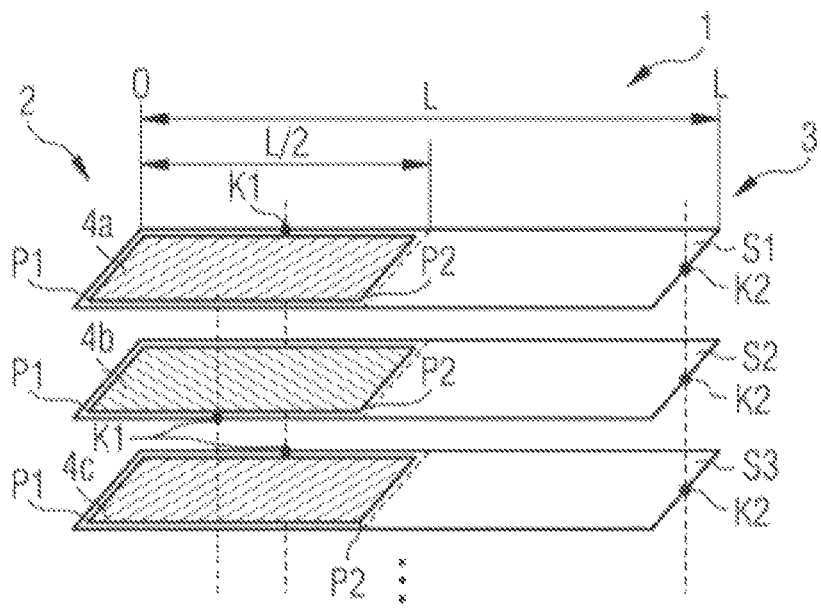
Figure 3:
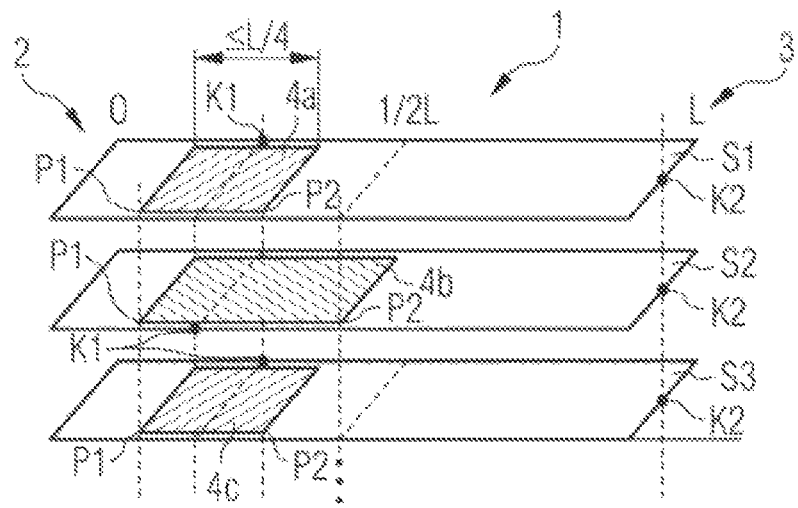
Figure 4:
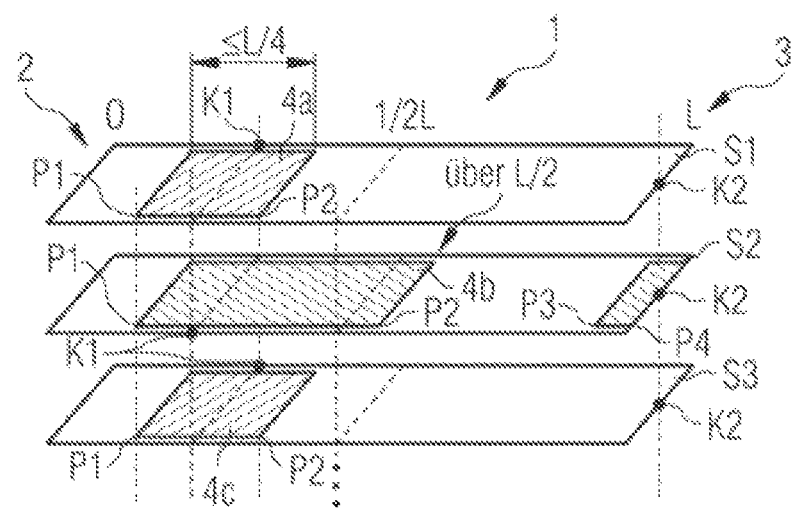
Figure 6:
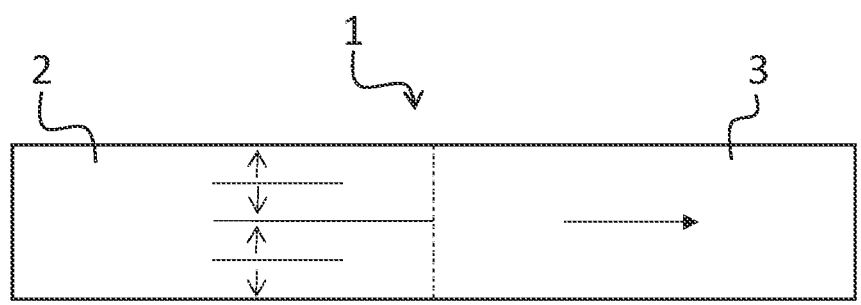

The Figures show in:

FIG. 1 characteristic power curves plotted against a normalized load on the output side of a piezoelectric transformer according to the prior art, FIG. 2 a schematic illustration of a partial layer structure of a piezoelectric transformer according to the prior art, FIG. 3 a schematic illustration of a partial layer structure of a piezoelectric transformer according to one embodiment of the invention, FIG. 4 a schematic illustration of a partial layer structure of a piezoelectric transformer according to a second embodiment of the invention, FIG. 5 a conventionally-used equivalent circuit diagram of a piezoelectric transformer, and FIG. 6 a cross-sectional view of a piezoelectric transformer.

FIG. 1 was already discussed in detail above, likewise was the equivalent circuit diagram of a piezoelectric transformer according to FIG. 5.

FIG. 2 shows a schematic illustration of a partial layer structure of a piezoelectric transformer according to the prior art. The transformer includes a piezoelectric element 1 with a predetermined longitudinal dimension of the length L, which is defined from the left side (length=0) to the right side (length=L). The piezoelectric element 1 comprises an input side 2, as well as an output side 3. The outer end of the output side 3 can, for example, be metallized, and can form an output electrode. The input side 2 extends on the left side of the piezoelectric element 1 in a range of 0 to ½L of the longitudinal dimension. The output side 3 extends on the right side of the piezoelectric element 1 in a range of ½L to L of the longitudinal dimension.

The piezoelectric element 1 is configured in multi-layer design, wherein multiple layers S1, S2 and S3 are illustrated in FIG. 2, which are structured in a direction perpendicular to the direction of the longitudinal dimension. For the purpose of better illustration, the layers S1 to S3 are illustrated separately from each other, but, in the produced component, are stacked above one another in the layering direction, and are form-connected for the formation of the piezoelectric element 1. Depending on the manufacturing method, this can be effected, for example, in a specific sintering process. The piezoelectric element 1 is, for example, composed of a PZT compound.

Onto each layer S1 to S3, a ply 4a, 4b and 4c of inner electrodes is respectively applied, which extend between a first position P1 and a second position P2 in a range from >0 to <½L on the input side 2 of the piezoelectric element 1. The plies 4a, 4b and 4c of inner electrodes can be electrically connected via lateral outer contacts K1, which are arranged as to alternate laterally on the outer side of the piezoelectric element 1, with an input-side voltage supply. In this way, an electrical voltage can be applied to the plies 4a to 4c of inner electrodes so that the piezoelectric element 1 and therefore, the piezoelectric transformer can be operated. In operation, the piezoelectric element 1 is induced to oscillations by means of an input-side sinusoidal AC voltage $U_{in}$, whereby a transverse wave forms along the longitudinal dimension. Due to this, an electrical output voltage $U_{out}$ is formed on the output side 3 of the piezoelectric element 1, wherein the input voltage $U_{in}$ is transformed into the output voltage $U_{out}$, according to a predetermined transformation ratio $U_{out}/U_{in}=K_u$. The output voltage $U_{out}$ can, via second external contacts K2, be tapped on the output side 3 of the piezoelectric element 1, or fulfill a certain other functionality. For example, the piezoelectric element 1 can be employed to be used as a piezoelectric transformer to ignite a non-thermal atmospheric-pressure plasma for plasma generation. Due to a very high output voltage $U_{out}$ on the output side 3 of the piezoelectric element 1, a non-thermal plasma can thus be generated under atmospheric pressure. Due to high electric field strengths on the output side 3, a certain working gas can be ionized, so that a working gas plasma develops.

The piezoelectric transformer, according to the partial layer structure shown in FIG. 2, constitutes a conventional structure. Its operating behavior substantially corresponds to the characteristic power curves I and II according to FIG. 1, whose properties have been already been discussed further above, and which are referred to at this point. The piezoelectric transformer according to FIG. 2 has the disadvantage that, in a characteristic range of the normalized output load according to FIG. 1, the input impedance at the input side 2 has capacitive behavior. This way, a reactive power component results at the input side, which takes effect as a power loss.

FIG. 3 shows a schematic illustration of a partial layer structure of a piezoelectric transformer according to a first embodiment of the invention having improved properties compared with the piezoelectric transformer as shown in FIG. 2. Also, in the transformer according to FIG. 3 by way of example, three layers S1 to S3 of a piezoelectric element 1 with plies 4a to 4c of inner electrodes correspondingly applied are illustrated. In FIG. 3, the inner electrodes are likewise arranged on the input side 2 of the piezoelectric element 1.

In contrast to the structure according to FIG. 2, the piezoelectric element 1 comprises two groups of layers, which, in the dimensions of the sub-sections of plies of inner electrodes differ in terms of the longitudinal dimension, and which are arranged alternately in the direction of the layer structure. In a first group of layers S1 and S3, the sub-sections of the plies 4a and 4c of inner electrodes are of shorter dimensions along the longitudinal dimension than they are in a second group of layers, represented by the layer S2, in which the sub-section of the illustrated ply 4b of the inner electrode is of longer dimension in terms of the longitudinal dimension. Of course, FIG. 3 is simply a detail of the layer structure. There are, in addition to the represented layer S2 having the ply 4b, yet further layers S2 having corresponding plies 4b.

Due to the fact that the sub-sections of the plies 4a and 4c of the first group of layers S1 and S3, and the sub-sections of plies 4b of the second group of layers S2 have different dimensions, the piezoelectric transformer according to FIG. 3 meets the condition $C_{in} \leq N^2 C_{out}$, wherein $C_{in}$ indicates the input capacitance, $C_{out}$ indicates the output capacitance, and N indicates the transformation ratio between the output side and the input side of the ideal transformer, according to a view of the equivalent circuit diagram of FIG. 5. The transformer according to FIG. 3 has the advantage over conventional transformers that due to the named condition, the input impedance is purely ohmic, and has no, or only negligibly small capacitive components. In this way, the input power on the input side 2 of the transformer is real and does not have any reactive power component. Thus, the time profiles of a periodic input voltage and a periodic input current are also in phase so that the phase shift at maximum efficiency is always $\varphi=0°$. The piezoelectric transformer according to FIG. 3 is therefore of particularly low loss, and does not require any additional components, such as for example a conventional series inductance in the control circuit.

Furthermore, the control of the piezoelectric transformer can be implemented very simply, according to FIG. 3, as merely one efficiency maximum must be regulated for, depending on a load located on the output side 3, without having to take into consideration a load-dependent phase shift between input voltage and input current at the input side 2 of the transformer. An output-side load can, for example, be designed variably in a manner such that the transformer is used for generating plasma, with the plasma having variable properties with respect to the working gas used or the atmosphere present.

Specifically, in the embodiment according to FIG. 3, the plies 4a and 4c of the inner electrodes according to the layers S1 and S3 are dimensioned in such a way that they extend between a first position P1 and a second position P2 symmetrically around the position at ¼L of the longitudinal dimension, and have a sub-section with a length ¼L. This means that the first position P1 is located at ⅛L, while the position P2 is located at ⅜L. Due to this dimensioning of the length of the inner electrodes in the layers S1 and S3, the input capacitance $C_{in}$ of the piezoelectric transformer can be made relatively small. In each case, the plies 4a and 4c of the inner electrodes in the layers S1 and S3 according to FIG. 3, are dimensioned significantly smaller than the plies 4a and 4c of the inner electrodes of the layers S1 and S3 in a transformer according to FIG. 2.

Furthermore, the configuration of the plies 4a and 4c of the inner electrodes in the layers S1 and S3 symmetrically around the position at ¼L has the advantage, that, when operating the transformer in a harmonic oscillation, with nodes at ¼L and ¾L, the mechanical stress at ¼L is minimal, and simultaneously at this position, excellent in-coupling properties for coupling the electrical energy into the piezoelectric element 1 are provided.

Furthermore, the ply 4b of the inner electrode of the layer S2 in FIG. 3 is dimensioned such that it extends between a first position P1 at ⅛L and a second position P2 at ½L. The inner electrode thus occupies a partial section with a length of ⅜L. Due to such a dimensioning, the output capacitance $C_{out}$ of the piezoelectric transformer according to FIG. 3, substantially acts like the output capacitance $C_{out}$ of the transformer according to FIG. 2. Due to the dimensioning of the plies 4a, 4b and 4c of the inner electrodes in the layers S1, S2, and S3 according to FIG. 3, it can thus be achieved for the transformer to satisfy the condition $C_{in} \leq N^2 C_{out}$.

FIG. 4 shows a schematic illustration of a partial layer structure of a piezoelectric transformer according to a second embodiment of the invention. The layer structure differs from the layer structure of FIG. 3 for one in that the ply 4b of the inner electrode, in layer S2, occupies a first sub-section between a first position P1 and a second position P2, wherein the first position P1 is arranged at ⅛L, and the position P2 is arranged in a range >½L, so that the inner electrode projects to the right beyond ½L. For example, the inner electrode of ply 4b occupies a sub-section of the length ≥⅜L and <¾L.

The layer structure according to FIG. 4 differs from the layer structure of FIG. 3, on the other hand, in that the inner electrode of the ply 4b, in the layer S2, extends in a second sub-section between a third position P3 and a fourth position P4 in a range ≥⅞L and ≤L. Due to the configuring of an additional electrode surface on the output side 3 of the layer S2, the output capacitance $C_{out}$ of the transformer can be increased, whereby the condition $C_{in} \leq N^2 C_{out}$ can also be satisfied.

It is also conceivable to combine the embodiments according to FIGS. 3 and 4, wherein on the left side, the ply 4b of inner electrodes of the layer S2 can be dimensioned according to the configuration in FIG. 3, and on the right side on the output side 3 may comprise an additional sub-section according to the configuration of FIG. 4. Other dimensioning within the generally specified areas of the type mentioned above are naturally likewise conceivable.

Generally, it is also conceivable to modify the electrode design and/or also the division of the layers S1, S2, S3 having corresponding plies 4a, 4b, 4c in the layering direction. In this regard, it is also conceivable to introduce intermediate layers that do not comprise any plies of inner electrodes. It is decisive here, that sub-sections of plies of a first group of layers and sub-sections of plies of a second group of layers have different dimensions with respect to the longitudinal dimension of the piezoelectric element 1, in order to satisfy the repeatedly-mentioned condition of the ratio of the input capacitance $C_{in}$ to the output capacitance $C_{out}$. For example, the ply 4b of the inner electrode from layer S2, according to FIG. 3, can occupy a length of between ⅜L and ½L of the longitudinal dimension. In general, a variety of possible combinations, configurations, but also modifications of the embodiments according to FIG. 3 and FIG. 4 are conceivable.

FIG. 6 shows a cross-sectional view of the piezoelectric transformer 1 of a similar embodiment as depicted in FIG. 3. The input side of the piezoelectric transformer 1 is marked with reference numeral 2, and the polarization of the layers of piezoelectric material in the input side 2 is shown by vertical arrows to be in a direction perpendicular to the longitudinal dimension. Further, the output side is marked with reference numeral 3 and the direction of the polarization of the layers of piezoelectric material in output side 3 is marked by a horizontal arrow depicted in output side 3.

The illustrated embodiments are merely chosen as an example.

LIST OF REFERENCE CHARACTERS 1 piezoelectric element
2 input side
3 output side
4a, 4b, 4c plies of inner electrodes
K1, K2 outer contacts
L length
P1 first position of a sub-section
P2 second position of a sub-section
P3 third position of a sub-section
P4 fourth position of a sub-section
S1, S2, S3 layers

The invention claimed is:

1. Piezoelectric transformer including a piezoelectric element with a predetermined longitudinal dimension of the length L, along which at least one input side of the transformer and at least one output side of the transformer are defined, wherein an input voltage $U_{in}$ can be applied on the input side for being transformed into an output voltage $U_{out}$ on the output side according to a transformation ratio $U_{out}/U_{in}=K_u$, and wherein the piezoelectric element comprises multiple plies of inner electrodes, which are arranged in a direction perpendicular to the direction of the longitudinal dimension in multiple different layers, characterized in that each ply of inner electrodes extends along at least one predetermined sub-section of the longitudinal dimension, and in that the sub-sections of plies of a first group of layers and the sub-sections of plies of a second group of layers have different dimensions, so that the piezoelectric transformer satisfies the following condition:

$$C_{in} \leq N^2 C_{out}$$

Wherein:
$C_{in}$ indicates the input capacitance, $C_{out}$ indicates the output capacitance, and N indicates the transformation ratio of the ideal transformer, and
plies of inner electrodes of the first group of layers each extend only along one predetermined sub-section of the longitudinal dimension between a first and a second position in a range >0 and ≤½L of the longitudinal dimension, and the respective sub-section, between the first and second positions, has a length of ≤¼L of the longitudinal dimension.

2. Piezoelectric transformer according to claim 1, wherein layers of the first group alternate with layers of the second group.

3. Piezoelectric transformer according to claim 1, wherein the plies of inner electrodes of the first group of layers each extend between the first and second positions symmetrically around the position at ¼L of the longitudinal dimension.

4. Piezoelectric transformer according to claim 1, wherein plies of inner electrodes of the second group of layers each extend between a first and a second position in a range >0 and ≤½L of the longitudinal dimension, and the respective sub-section, between the first and the second positions, has a length of >¼L and <½L of the longitudinal dimension.

5. Piezoelectric transformer according to claim 4, wherein the plies of inner electrodes of the second group of layers each extend between a first and a second position in a range >0 and ≤¾L of the longitudinal dimension, and the respective sub-section, between the first and second positions, has a length of ≥⅜L and <¾L of the longitudinal dimension.

6. Piezoelectric transformer according to claim 5, wherein the plies of inner electrodes of the second group of layers each additionally extend in a sub-section between a third and a fourth position in a range ≥⅞L and ≤L of the longitudinal dimension.

7. Piezoelectric transformer according to claim 5, wherein, with respect to the longitudinal dimension, the first position of the plies of inner electrodes of the second group of layers corresponds to the first position of the plies of inner electrodes of the first group of layers.

8. Piezoelectric transformer according to claim 1, wherein the piezoelectric element is polarized in a direction perpendicular to the direction of the longitudinal dimension on the input side, and is polarized in the direction of the longitudinal dimension on the output side.

9. Piezoelectric transformer according to claim 1, wherein the input side is configured in the range 0 to ½L of the longitudinal dimension of the piezoelectric element, and the output side is configured in the range ½L to L of the longitudinal dimension of the piezoelectric element.

10. Piezoelectric transformer according to claim 1, wherein plies of inner electrodes of the second group of layers each extend between a first and a second position in a range >0 and ≤½L of the longitudinal dimension, and the respective sub-section, between the first and the second positions, has a length of >¼L and <½L of the longitudinal dimension.

11. Piezoelectric transformer according to claim 10, wherein the plies of inner electrodes of the second group of layers each extend between a first and a second position in a range >0 and ≤¾L of the longitudinal dimension, and the respective sub-section, between the first and second positions, has a length of ≥⅜L and <¾L of the longitudinal dimension.

12. Piezoelectric transformer according to claim 11, wherein the plies of inner electrodes of the second group of layers each additionally extend in a sub-section between a third and a fourth position in a range ≥⅞L and ≤L of the longitudinal dimension.

13. Piezoelectric transformer according to claim 11, wherein, with respect to the longitudinal dimension, the first position of the plies of inner electrodes of the second group of layers corresponds to the first position of the plies of inner electrodes of the first group of layers.

14. Piezoelectric transformer according to claim 12, wherein, with respect to the longitudinal dimension, the first position of the plies of inner electrodes of the second group of layers corresponds to the first position of the plies of inner electrodes of the first group of layers.

15. Piezoelectric transformer including a piezoelectric element with a predetermined longitudinal dimension of the length L, along which at least one input side of the transformer and at least one output side of the transformer are defined, wherein an input voltage $U_{in}$ can be applied on the input side for being transformed into an output voltage $U_{out}$ on the output side according to a transformation ratio $U_{out}/U_{in}=K_u$, and wherein the piezoelectric element comprises multiple plies of inner electrodes, which are arranged in a direction perpendicular to the direction of the longitudinal dimension in multiple different layers, characterized in that each ply of inner electrodes extends along at least one predetermined sub-section of the longitudinal dimension, and in that the sub-sections of plies of a first group of layers and the sub-sections of plies of a second group of layers have different dimensions, so that the piezoelectric transformer satisfies the following condition:

$$C_{in} \leq N^2 C_{out}$$

wherein $C_{in}$ indicates the input capacitance, $C_{out}$ indicates the output capacitance, and N indicates the transformation ratio of the ideal transformer, and wherein the plies of inner electrodes of the first group of layers each extend between a first and a second position in a range >0 and ≤½L of the longitudinal dimension, and the respective sub-section, between the first and second positions, has a length of ≤¼L of the longitudinal dimension.

16. Piezoelectric transformer according to claim 15, wherein the piezoelectric transformer is configured to enable controlling of the piezoelectric transformer via an input voltage signal generated through a high-frequency pulse-width modulated switching signal.

17. Piezoelectric transformer according to claim 16, wherein the input voltage signal comprises a sinusoidal signal.

* * * * *